United States Patent
Hu et al.

(10) Patent No.: US 7,038,316 B2
(45) Date of Patent: May 2, 2006

(54) BUMPLESS DIE AND HEAT SPREADER LID MODULE BONDED TO BUMPED DIE CARRIER

(75) Inventors: Chuan Hu, Chandler, AZ (US);
Daoqiang Lu, Chandler, AZ (US);
Zhiyong Wang, Chandler, AZ (US);
Gilroy Vandentop, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 10/811,370

(22) Filed: Mar. 25, 2004

(65) Prior Publication Data

US 2005/0211749 A1    Sep. 29, 2005

(51) Int. Cl.
*H01L 23/48* (2006.01)
*H01L 23/52* (2006.01)
*H01L 29/40* (2006.01)

(52) U.S. Cl. .................. 257/738; 257/778; 257/704

(58) Field of Classification Search ..................... None
See application file for complete search history.

(56) References Cited

U.S. PATENT DOCUMENTS

| | | | |
|---|---|---|---|
| 6,317,326 B1 * | 11/2001 | Vogel et al. ................. | 361/704 |
| 6,455,943 B1 * | 9/2002 | Sheu et al. .................. | 257/786 |
| 2004/0036170 A1 * | 2/2004 | Lee et al. .................... | 257/734 |
| 2004/0042178 A1 * | 3/2004 | Gektin et al. ................ | 361/705 |
| 2004/0159957 A1 * | 8/2004 | Lee ............................. | 257/778 |
| 2004/0188817 A1 * | 9/2004 | Hua et al. .................... | 257/684 |

* cited by examiner

*Primary Examiner*—Tu-Tu Ho
(74) *Attorney, Agent, or Firm*—Schwabe, Williamson & Wyatt, P.C.

(57) ABSTRACT

An IC package is assembled from a bumpless die, a die carrier having a plurality of solder bumps thereon, and a heat spreader lid. The bumpless die is bonded to the heat spreader lid to form a module and then the module is bonded to the bumped die carrier.

14 Claims, 5 Drawing Sheets

BUMPLESS DIE AND HEAT SPREADER LID MODULE BONDED TO BUMPED DIE CARRIER

BACKGROUND OF THE INVENTION

1. Field of the Invention

The present invention relates to microelectronic devices, and in particular, to packaging for microelectronic devices.

2. Description of Related Art

FIG. 1 shows a prior art Integrated Circuit (IC) package 10, which includes a substrate or die carrier 12 with the IC die 14 mounted thereon. An underfill 16, used for mechanical support and electrical insulation, is interposed between the IC die 14 and the die carrier 12. An Integrated Heat Spreader (IHS) lid 18 is mounted to the die carrier 12 by way of a sealant 20. A Thermal Interface Material (TIM) 22 bonds the IC die 14 and the IHS lid 18 together for heat removal. Solder bumps are placed on bonding pads located both on the IC die 14 and the die carrier 12. In a "flip-chip" attachment process, the IC die 14 is flipped upside down and attached directly to the die carrier 12 by the solder bumps on the die 14 and the solder bumps on the carrier 12 joining to form the solder joints 24. These traditional flip chip packages, whether ball grid array (BGA) or pin grid array (PGA) packages, have solder bumps which are referred to as Control Collapsed Chip Connection (C4) bumps.

Many applications may benefit from thinned dice. However, large diameter wafers must be thicker in order to maintain structural integrity and planarity during a wide range of processing steps encountered during IC fabrication. As a practical matter, prior art bumped dice (such as the die 14) may only be thinned to a thickness of about 125 microns because of the presence of the solder bumps 24 to the IC die 14. More specifically, when a grind pad is used to thin the wafer by removing silicon from its backside, the front side of the wafer, which has the solder bumps, is mounted on a support substrate. As a consequence, the solder bumps may imprint on the thinned wafer. More specifically, where there is a bump, there is a force applied by the support substrate and where there is not a bump, a force is not applied by the support substrate. Hence, a special bump protection adhesive is required to fill in between the wafer and the support substrate to uniformly distribute the force. However, the support substrate and the adhesive needed to be removed after wafer thinning process is completed. The presence of the bumps generates great difficulty in removing the support and the adhesive, especially when the wafer is very thin (less than 50 microns thick). Likewise, it is not practical to thin the wafer prior to attaching the solder bumps. The typical wafer from which dice are produced has a thickness of about 775 microns. When the wafer's thickness is reduced to 125 microns or less, the wafer cannot support its own weight. Consequently, to fabricate the solder bumps to the thinned wafer, extra compensatory support for the thinned wafer is necessary, which would be expensive and complicated.

One issue which must be addressed in the connection of various different types of materials (i.e., die, die carrier, IHS, TIM, etc.) is the Coefficient of Thermal Expansion (CTE) for each material. The CTE is a measurement of the expansion and contraction of each material during heating and cooling cycles, respectively. A material having a higher CTE than the surrounding material it joins expands and contracts at a faster rate than the surrounding material when heated and cooled (e.g., after bonding), respectively, leading to a CTE mismatch which may cause stress and warpage. Local stress may be caused by a CTE mismatch between the solder bumps 24 (may be as tall as 15 to 50 microns) and a low k Interlayer Dielectric (ILD) layer. Global stress may be caused by a CTE mismatch between the IC die 14, IHS lid 18 and die carrier 12. In the prior art, the underfill 16 may be used to reduce global stress; however, it may be difficult to fill the relatively small gap between die 14 and die carrier 12 with the underfill 16. In the prior art, the local stress may be partially reduced by using "softer" solder material like SnPb in the solder balls, which may not be environmental friendly.

The thermal interface material (TIM) 22 in the prior art IC package 10 is a soft solder and has a thickness of around 200 microns. At this thickness, the TIM 22 may not deliver the thermal performance desired when the IC die 14 is a high performance processor die. If the thickness of the TIM 22 is made substantially less than this to achieve the desired thermal performance, it may be insufficient to bond together reliably the IC die 14 and IHS lid 18 because of the stress generated from CTE mismatch.

A dual Damascene process, which makes use of copper as an interconnect material, has been used in the prior art to form interconnection lines (traces) and vias between interconnected levels at the same time. The Dual Damascene process uses a metallization approach that fills trenches etched into an insulator, followed by a Chemical-Mechanical Polishing (CMP) step.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
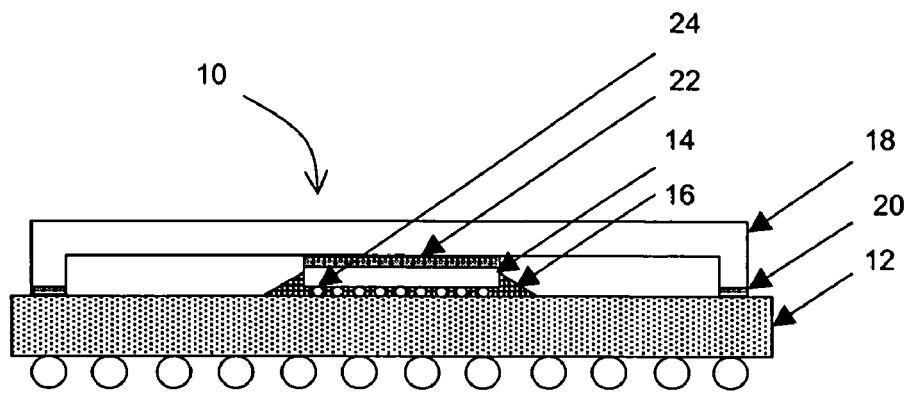
FIG. 1 is a diagram of an illustrative prior art IC package.
Figure 2:
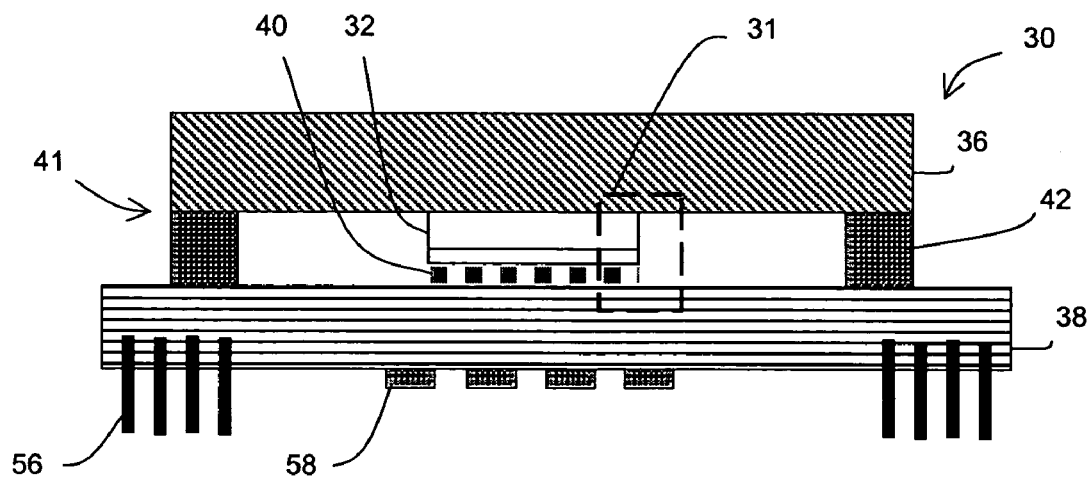
FIG. 2 is a diagram of an IC package according to one embodiment of the present invention.
Figure 3:
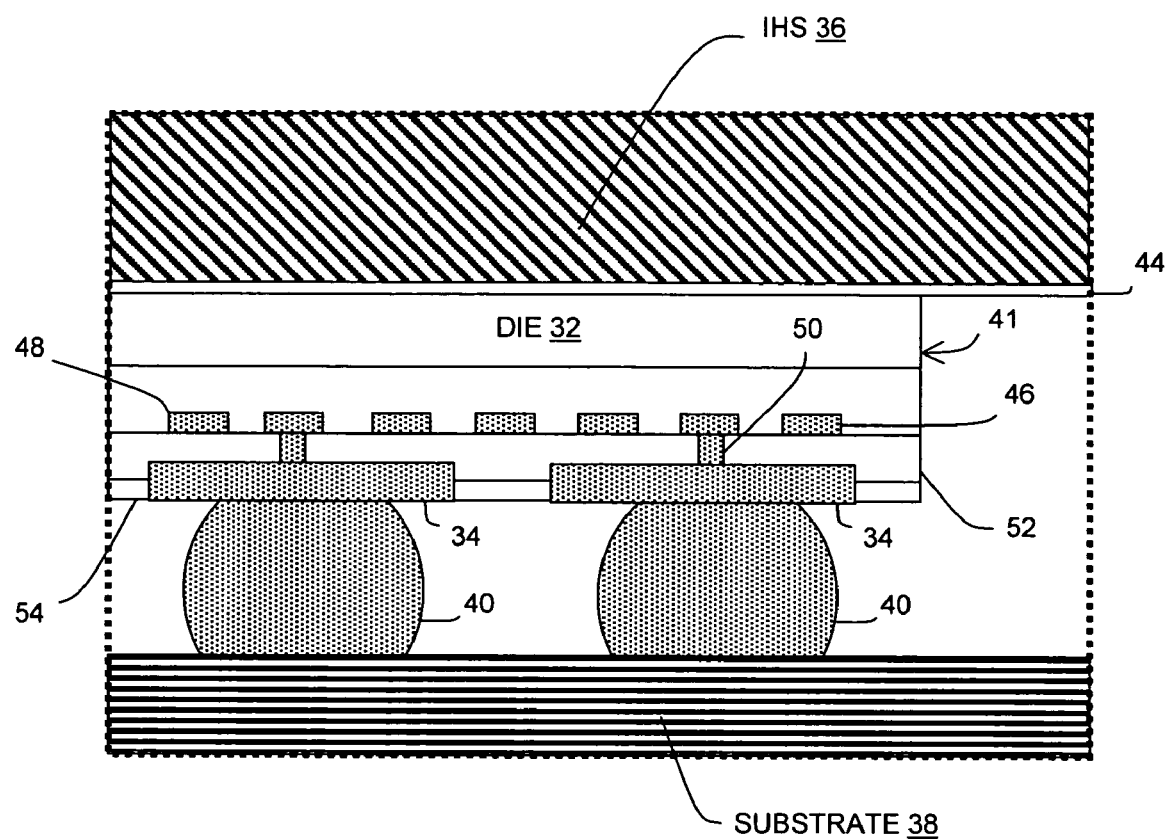
FIG. 3 is an enlarged segment view of a magnified portion of the IC package of FIG. 2, according to one embodiment of the present invention.

With reference to FIGS. 2 and 3, there is shown an Integrated Circuit (IC) package 30 in accordance with one embodiment of the present invention. FIG. 3 shows an enlarged segment view of a magnified portion of the IC package 30 contained within a dashed box 31 in FIG. 2. The IC package 30 includes a thinned IC die 32 with a plurality of bonding pads 34, an Integrated Heat Spreader (IHS) lid 36, and a substrate or die carrier 38 which has a plurality of solder bumps 40. In one embodiment, the bonding pads 34 may be dual-Damascene-formed copper (Cu) bonding pads. In one embodiment, the solder bumps 40 may be coined solder bumps having a height of approximately 10 to 50 microns.

The solder bumps 40 are fabricated to the die carrier 38 and not to the IC die 32 in an assembly process, according to one method of the present invention. In this assembly process, the bumpless IC die 32 (i.e., without solder bumps) is attached to the IHS lid 36 to forms a die/IHS lid module 41. Thereafter, the module 41 is bonded on the bumped die carrier 38 (i.e., with the solder bumps 40). The solder bumps 40 on the die carrier 38 may wet the copper bonding pads 34 of the IC die 32 to form electrical and mechanical interconnections. In other words, the thinned, bumpless die 32 is bonded to IHS lid 36 first and then the die/IHS lid module 41 is bonded on the bumped die carrier 38 by melting the solder bumps 40 to form the interconnections. Since the thinned die 32 already is bonded to the IHS lid 36, sufficient support for the die 32 is provided by the IHS lid 36. Hence, this assembly process of using a bumpless die 32 allows for use of a thinned die 32, as will be described in more detail hereafter. Also, this assembly process, in accordance with one method of the present invention, is described in more detail with respect to FIGS. 4–7.

With respect to the dual-Damascene-formed copper bonding pads 34, a dual damascene pad formation process may replace the C4 bump process of the prior art. The solder bumps 40 fabricated on the die carrier 38 may be aligned with the die bonding pads 34 on the IC die 32, instead of aligning the bumps with a freestanding die as undertaken in the prior art C4 bump process. Making the IC die 32 bumpless by mounting the solder bumps 40 only to the die carrier 38 may significantly simplify the wafer thinning processes to be described hereinafter and may enable thinning the wafer to a smaller thickness of approximately 25 microns. The thinned die 32 may have better thermal and reliability performance as the result of thermal path reduction and greater die compliance. With respect to this improved thermal performance, a junction-to-case thermal impedance ($R_{JC}$) of this IC package 30 may be greatly reduced. With respect to this bumpless die 32 approach simplifying wafer thinning, manufacturing costs may be reduced. More specifically, the wafer thinning may be simpler because there are no solder bumps on the IC die 32; hence, there is no need for using, for example, the previously-described special bump protection adhesive, and all the process steps related the adhesive are eliminated.

A Thermal Interface Material (TIM) 44 may bond the IC die 32 and the IHS lid 36 together for heat removal and mechanical bonding. In one embodiment, the bonding between the IC die 32 and the IHS lid 36 may use a fluxless process in an inert environment (e.g., N2 or H2 purged furnace). The TIM 44 may comprise a metallic bond using a hard solder such as eutectic AuSn solder, SnAgSb, etc. This fluxless process may allow for the TIM 44 to be relatively thin, e.g., around 5–20 microns. Hence, the thinness of the TIM 44 may complement the previously-described thinness of the IC die 32, so that the thinness of both may contribute to an improved thermal performance for the IC package 30. In one embodiment, the IHS lid 36 may be mounted to the die carrier 38 by use of a sealant 42.

The bonding pads 34 may be coupled to traces 46 in one or more interconnect layers 48 by way of vias 50. In one embodiment, a low k Interlayer Dielectric (ILD) layer 52 may be interposed between the bonding pads 34 and the interconnect layer 48 to provide insulation. The vias 50 pass through this ILD layer 52. In one embodiment a passivation layer 54, in the form of a passivation nitride, may be affixed to the ILD layer 52 between the bonding pads 34 so as to provide a relatively smooth, planar underside for the IC die 32.

The IHS lid 36 may force the thinned die 32, which is firmly bonded, to be compliant with it, and thus the die 32 may have an effective CTE as high as 15 ppm/C (close to 16 ppm/C). Hence, the die 32, die carrier 38 and IHS lid 36 may have similar CTEs. The thinned die 32 may reduce both the previously-described global stress from Coefficient of Thermal Expansion (CTE) mismatch of the die 32 and the die carrier 38 and the previously-described local stress from CTE mismatch of the solder bumps 40 and the ILD layer 52, which may cause the delamination of the ILD layer 52. These reductions of global and local stresses may reduce stress in the ILD layer 52, the IHS lid 36, and the TIM 44. In particular, this provides better protection of the ILD layer 52, e.g., protection against cracks. In summary, removing the bumps from the die 32 and placing them only on the die carrier 38 during assembly may allow the die to be made thinner, which in turn may reduce global and local stresses, and which in turn may provide better protection for ILD layer 52, e.g., reduced cracks, etc.

Due to the reduced stress, in one embodiment no underfill may be required with the IC package 30, as used in the prior art designs to reduce the stress. Alternatively, a capillary underfill with no or low filler (a "no-filler underfill") or a no-flow underfill may be used to enhance the reliability of the package.

FIG. 2 shows the IC package 30 in the form of a Pin Grid Array (PGA) package with an array of pins 56. However, the IC package 30 may take other forms, such as a Ball Grid Array (BGA) with solder balls instead of pins for the die-to-board interconnections. In one embodiment, a plurality of decoupling capacitors 58 may be mounted to the bottom of the die carrier 38.

Figure 4:
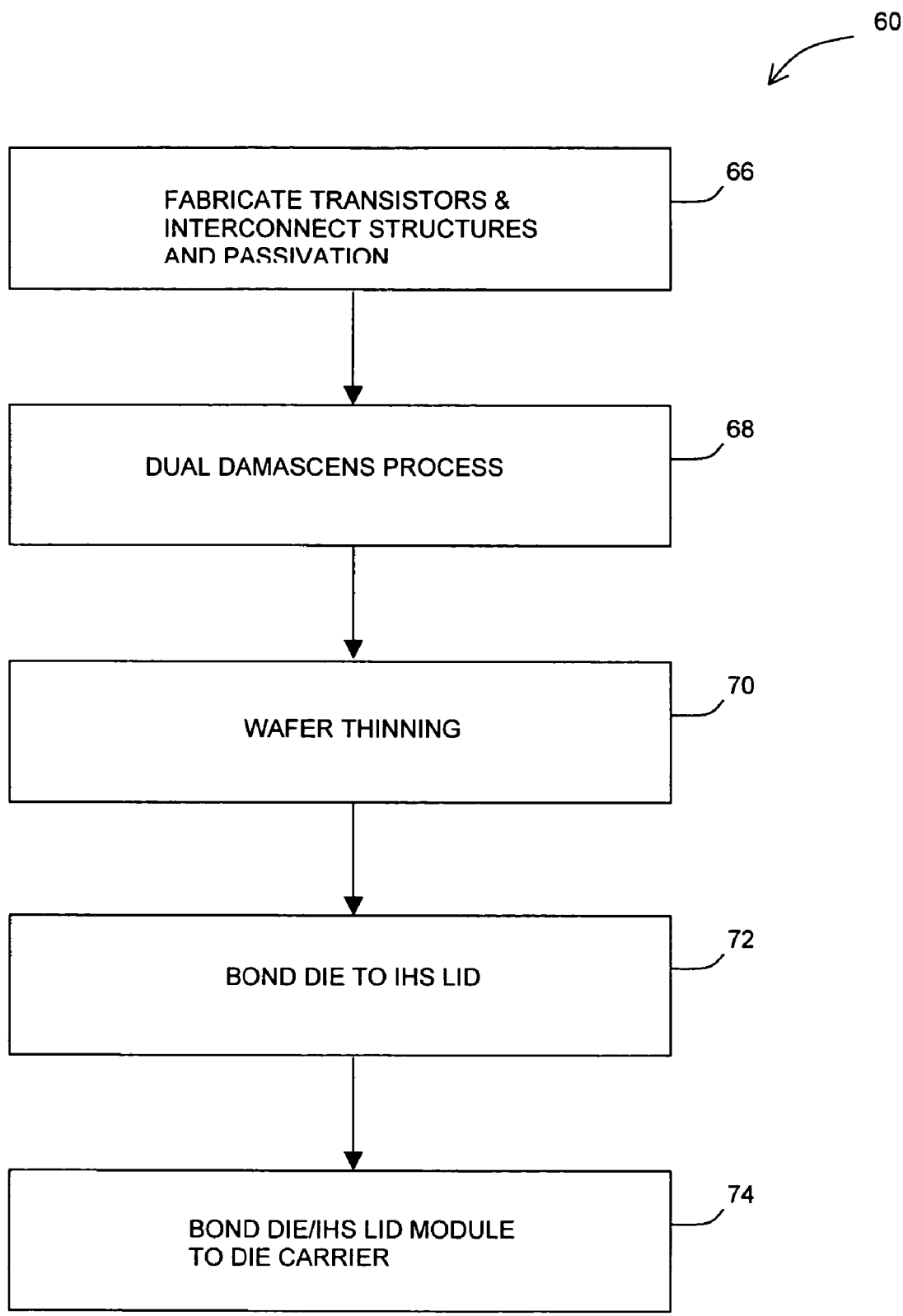
FIG. 4 is a flow chart of an assembly process, according to one method of the present invention, for fabricating the IC package of FIG. 2, according to one embodiment of the present invention.
Figure 5:
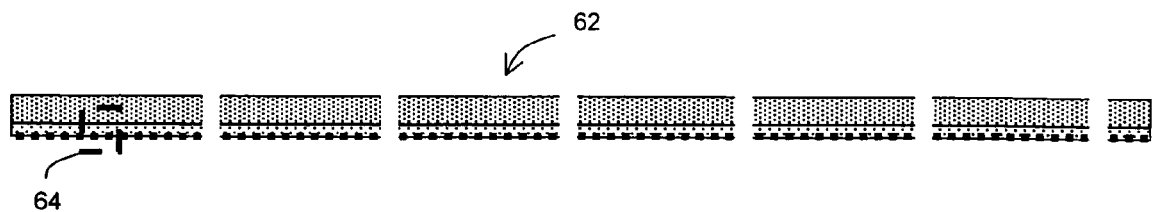
FIG. 5 is a diagram of a wafer which is subjected to the assembly process of FIG. 4, according to one method of the present invention.

The assembly process, designated by the reference number 60, for the fabrication of the IC package 30 of FIGS. 2 and 3 is shown in a flow chart of FIG. 4. This assembly process 60 of FIG. 4 will be described in conjunction with FIGS. 2, 3, 5, 6 and 7, which illustrate the IC package 30 as it passes through various stages of the assembly process 60 of FIG. 4. FIG. 5 is a side view of a wafer 62 subjected to the assembly process 60 and FIG. 6 is an enlarged segment view of a magnified portion of the wafer 62 shown in a dashed box 64 in FIG. 5.

Figure 6:
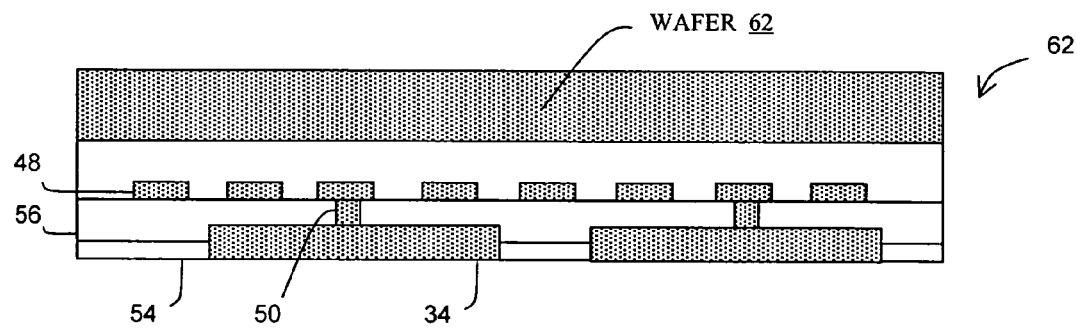
FIG. 6 is an enlarged segment view of a magnified portion of the wafer of FIG. 5 during one of the phases of the assembly process of FIG. 4, according to one method of the present invention.

At a block 66 of the assembly process 60 in FIG. 4, transistors and interconnect structures, such as the interconnect layer 48 in FIG. 6, are formed in the wafer 62 and represent the starting point for the assembly process 60. At block 66, there are the depositions of the ILD layer 52 and the passivation layer 54. Use of the passivation layer 54 may different from its use in other packages, where there is no planarization on the passivation layer 54. Use of different materials for the passivation layer 54 and ILD layer 52 may provide additional strength whereas the ILD layer 52 by itself may be too weak. Additionally, the passivation layer 54 may prevent moisture uptake of ILD layer 52. Hence, instead of using SiO2 only, in one embodiment a porous low k material may be used for the ILD layer 52 and SiO2 or other dense material may be used for the passivation layer 54. The passivation layer 54 may be deposited to become an integral part of the ILD layer 52.

At a block 68 of the assembly process 60 in FIG. 4, the dual Damascene process is undertaken wherein the IDL layer 52 and the passivation layer 54 may be patterned with the vias and the copper bonding pads. Referring to FIGS. 5 and 6, the results of this dual Damascene process are shown in detail. The ILD layer 52 and the passivation layer 54 may be patterned to form of the vias 50 and copper bonding pads 34. The passivation layer 54 may leave a planar surface on the wafer 62, which may enable thinning of the wafer 62 to 50 microns or below, for example. In other words, there are no protruding solder bumps, as in the prior art, which would make thinning the wafer 62 impractical.

In the dual Damascene plating process, the ILD layer 52 and the passivation layer 54 may start as an insulator sandwich of two insulation layers (not shown), with three etch stops—one interposed between the two insulator layers and one on the periphery of each insulator layer. Successive resist layers may be patterned and the insulator layers may be etched to form interconnected openings of two different widths, one for the vias 50 and one for the bonding pads 34. A barrier layer and a copper seed layer may be deposited, followed by the plating with copper. Excessive copper may be removed by a CMP process which leaves the die 32 with a planar surface having the embedded bonding pads 34.

At a block 70 of the assembly process 60 in FIG.4, the wafer is thinned (to approximately 50 microns, for example) by mounting a front side of the wafer on a support substrate carrier (not shown) using, for example, an ultraviolet (UV) releasable or thermal releasable double-sided adhesive tape. After wafer thinning is completed, the next step is to deposit a metallization on the backside of the wafer. Thereafter, the assembly process 60 may include wafer/support substrate mounting on a dicing frame, support substrate/tape releasing, wafer dicing and die singulation, providing for the separation of individual die, such as die 32.

Figure 7:
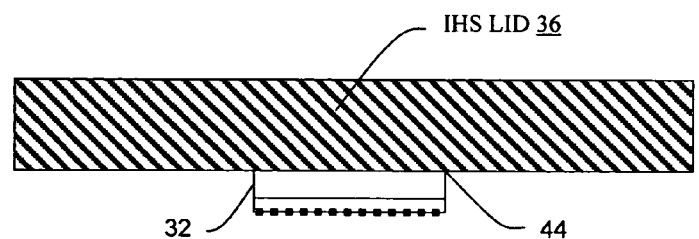
FIG. 7 shows the IC package of FIG. 1, according to one embodiment of the present invention, during one of the phases of the assembly process of FIG. 4, according to one method of the present invention.

With reference to FIGS. 4 and 7, at a block 72 of the assembly process 60, the thinned die 32 then may be bonded to the IHS lid 36 with the previously-described TIM 44, comprising the metallic bond, using the fluxless process in the previously-mentioned inert environment (e.g. N2 or H2 purged furnace). The IHS lid 36 may be made of copper and may have, for example, a thickness of 2 to 3 mm. This fluxless process may allow for a thinned die 32 for the previously described thermal advantage.

With reference to FIGS. 2, 3 and 4, at a block 74 of the assembly process 60, the die/IHS lid module 41 may be bonded to the die carrier 38 with solder bumps 40 directly without underfill. Alternatively, the no-flow or no-filler underfill may be used to enhance mechanical protection or electrical insulation. The bump pitch on die carrier 38 may be designed to match the pitch of the bonding pads 34 on the die 32. Then the whole IC package 30 may be sealed with sealant (not shown) for further protection.

Figure 8:
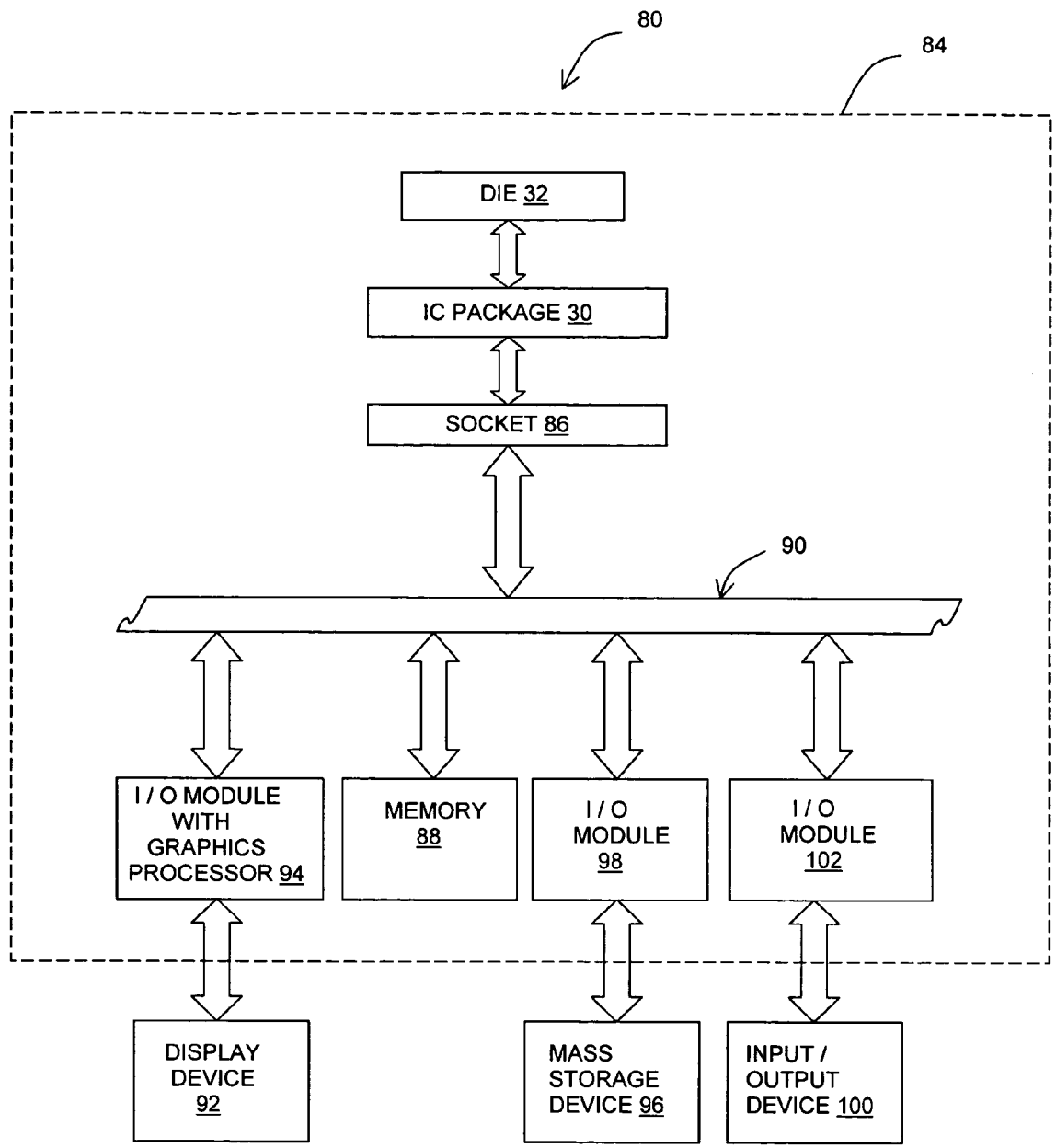
FIG. 8 is a block diagram of a system incorporating the IC package of FIG. 1, according to one embodiment of the present invention.

Referring to FIG. 8, there is illustrated a system 80, which is one of many possible systems in which the IC package 30 of FIGS. 2 and 3 may be used. In the system 80 the IC package 30 is mounted on a substrate or printed circuit board (PCB) 84 via a socket 86. The IC die 32 of the IC package 30 may be a processor and the PCB 84 may be a motherboard. However, in other systems the IC package 30 may be directly coupled to the PCB 84 (eliminating the socket 86 which allows the IC package 30 to be removable). In addition to the socket 86 and the IC package 30, the PCB 84 may have mounted thereon a main memory 88 and a plurality of input/output (I/O) modules for external devices or external buses, all coupled to each other by a bus system 90 on the PCB 84. More specifically, the system 80 may include a display device 92 coupled to the bus system 90 by way of an I/O module 94, with the I/O module 94 having a graphical processor and a memory. The I/O module 94 may be mounted on the PCB 84 as shown in FIG. 8 or may be mounted on a separate expansion board. The system 80 may further include a mass storage device 96 coupled to the bus system 90 via an I/O module 98. Another I/O device 100 may be coupled to the bus system 90 via an I/O module 102. Additional I/O modules may be included for other external or peripheral devices or external buses.

Examples of the main memory 88 include, but are not limited to, static random access memory (SRAM) and dynamic random access memory (DRAM). The memory 88 may include an additional cache memory. Examples of the mass storage device 96 include, but are not limited to, a hard disk drive, a compact disk drive (CD), a digital versatile disk driver (DVD), a floppy diskette, a tape system and so forth. Examples of the input/output devices 100 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 84. Examples of the bus system 90 include, but are not limited to, a peripheral control interface (PCI) bus, and Industry Standard Architecture (ISA) bus, and so forth. The bus system 90 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 90. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC die 32 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

In various embodiments, the system 80 may be a wireless mobile or cellular phone, a pager, a portable phone, a one-way or two-way radio, a personal digital assistant, a pocket PC, a tablet PC, a notebook PC, a desktop computer, a set-top box, an entertainment unit, a DVD player, a server, a medical device, an internet appliance and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
a bumpless die having a substantially planar surface with a plurality of embedded bonding pads;
a heat spreader lid having the bumpless die mounted in a compliant relationship with the heat spreader lid to form a module;
a die carrier having a plurality of solder bumps attached thereto;
the module being mounted to the die carrier with the solder bumps being bonded to the bonding pads when the module is mounted to the die carrier;
the die having a thickness no greater than 50 microns; and
a thermal interface material in the form of a hard solder interposed between the die and the heat spreader lid to bond the die to the heat spreader lid.

2. The apparatus of claim 1, wherein the bonding pads are dual-Damascene-formed copper bonding pads.

3. The apparatus of claim 2, wherein the hard solder is selected from a group consisting of AuSn and SnAgSb.

4. The apparatus of claim 3, wherein the thermal interface material has a thickness no greater than 20 microns.

5. The apparatus according to claim 2, wherein the plurality of solder bumps forms a gap between the die and the die carrier, with the gap containing only the plurality of solder balls and empty space.

6. The apparatus according to claim 2, wherein the plurality of solder bumps forms a gap between the die and the die carrier, with the gap containing only the plurality of solder balls and an underfill.

7. The apparatus according to claim 2, wherein the solder bumps and the gap have a height of approximately 10 to 50 microns.

8. The apparatus according to claim 1, wherein the die has an effective coefficient of thermal expansion in a range of 15 ppm/C to 16 ppm/C.

9. A system, comprising:
an integrated circuit (IC) package including a bumpless die having a substantially planar surface with a plurality of embedded bonding pads; a heat spreader lid having the bumpless die mounted in a compliant relationship with the heat spreader lid to form a module; a die carrier having a plurality of solder bumps attached thereto; and the module being mounted to the die carrier with the solder bumps being bonded to the bonding pads when the module is mounted to the die carrier;
a circuit board having mounted thereon the IC package; a dynamic random access memory coupled to the IC package; and an input/output interface coupled to the IC package;
the die having a thickness no greater than 50 microns; and
a thermal interface material in the form of a hard solder interposed between the die and the heat spreader lid to bond the die to the heat spreader lid.

10. The system according to claim 9, wherein the IC die is a microprocessor and the circuit board is a motherboard.

11. The system according to claim 10, wherein the input/output interface comprises a networking interface.

12. The system according to claim 11, wherein the system is a selected one of a set-top box, an entertainment unit and a DVD player.

13. The system according to claim 9, wherein the bonding pads are dual-Damascene-formed copper pads.

14. The system according to claim 13, wherein the hard solder is selected from a group consisting of AuSn and SnAgSb.

* * * * *